US010943559B2

(12) United States Patent
Park

(10) Patent No.: US 10,943,559 B2
(45) Date of Patent: Mar. 9, 2021

(54) DISPLAY DRIVER IC INCLUDING OSCILLATOR FREQUENCY CONTROLLER

(71) Applicant: MagnaChip Semiconductor, Ltd., Cheongju-si (KR)

(72) Inventor: Sang Su Park, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 59 days.

(21) Appl. No.: 16/539,555

(22) Filed: Aug. 13, 2019

(65) Prior Publication Data

US 2020/0074958 A1    Mar. 5, 2020

(30) Foreign Application Priority Data

Aug. 28, 2018    (KR) .......................... 10-2018-0101601

(51) Int. Cl.
*H03L 7/24*  (2006.01)
*G09G 5/00*  (2006.01)
*G09G 3/20*  (2006.01)

(52) U.S. Cl.
CPC .............. *G09G 5/006* (2013.01); *G09G 3/20* (2013.01); *H03L 7/24* (2013.01); *G09G 2310/08* (2013.01); *G09G 2330/06* (2013.01); *G09G 2370/10* (2013.01)

(58) Field of Classification Search
None
See application file for complete search history.

(56) References Cited

U.S. PATENT DOCUMENTS

| | | | | |
|---|---|---|---|---|
| 8,773,213 | B2* | 7/2014 | Nishitani | H01L 27/0682 331/135 |
| 8,981,858 | B1* | 3/2015 | Wright | H04B 15/06 331/78 |
| 9,479,113 | B2* | 10/2016 | Yamamoto | H03B 5/26 |
| 2008/0100350 | A1* | 5/2008 | Pernia | H03B 5/1243 327/114 |
| 2020/0118517 | A1* | 4/2020 | Park | G09G 5/14 |

* cited by examiner

*Primary Examiner* — Parul H Gupta
(74) *Attorney, Agent, or Firm* — NSIP Law

(57) ABSTRACT

A display driver IC includes a register map, an oscillator, a timing controller, an oscillator scatter, and an intellectual property (IP) block. The register map is configured to store a trim code of a fixed frequency and scatter option information. The oscillator is configured to generate an oscillator clock based on the trim code. The timing controller is configured to generate an internal synchronization signal based on the oscillator clock. The oscillator scatter is configured to output a modified trim code to the oscillator based on the trim code, the scatter option information, and the internal synchronization signal. The intellectual property (IP) block is configured to receive a modified oscillator clock generated in the oscillator based on the modified trim code.

26 Claims, 11 Drawing Sheets

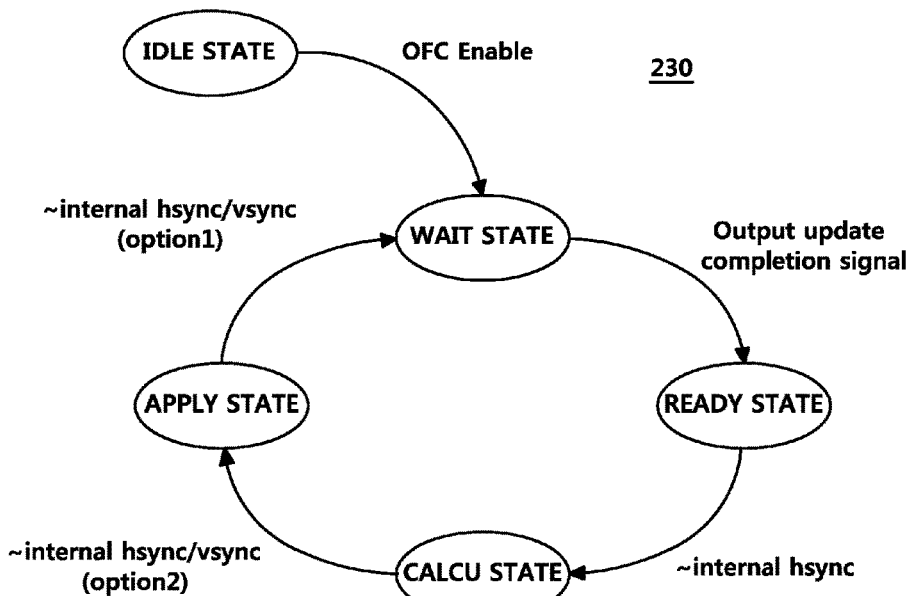

FIG.9(a)

| WAIT STATE entering Option1 | APPLY STATE entering Option2 | Effect obtained by applying options 1 and 2 |
|---|---|---|
| 0 vsync synchronization | 0 vsync synchronization | Apply stabilization for one frame compensation trim codes are not mixed for frame |
| 0 vsync synchronization | 1 hsync synchronization | Apply stabilization for 1h or more compensation trim codes may be mixed for frame |
| 1 hsync synchronization | 0 vsync synchronization | Apply stabilization for 1h or more compensation trim codes are not mixed for frame |
| 1 hsync synchronization | 1 hsync synchronization | Apply stabilization for 1h compensation trim codes may be mixed for frame |

FIG.9(b)

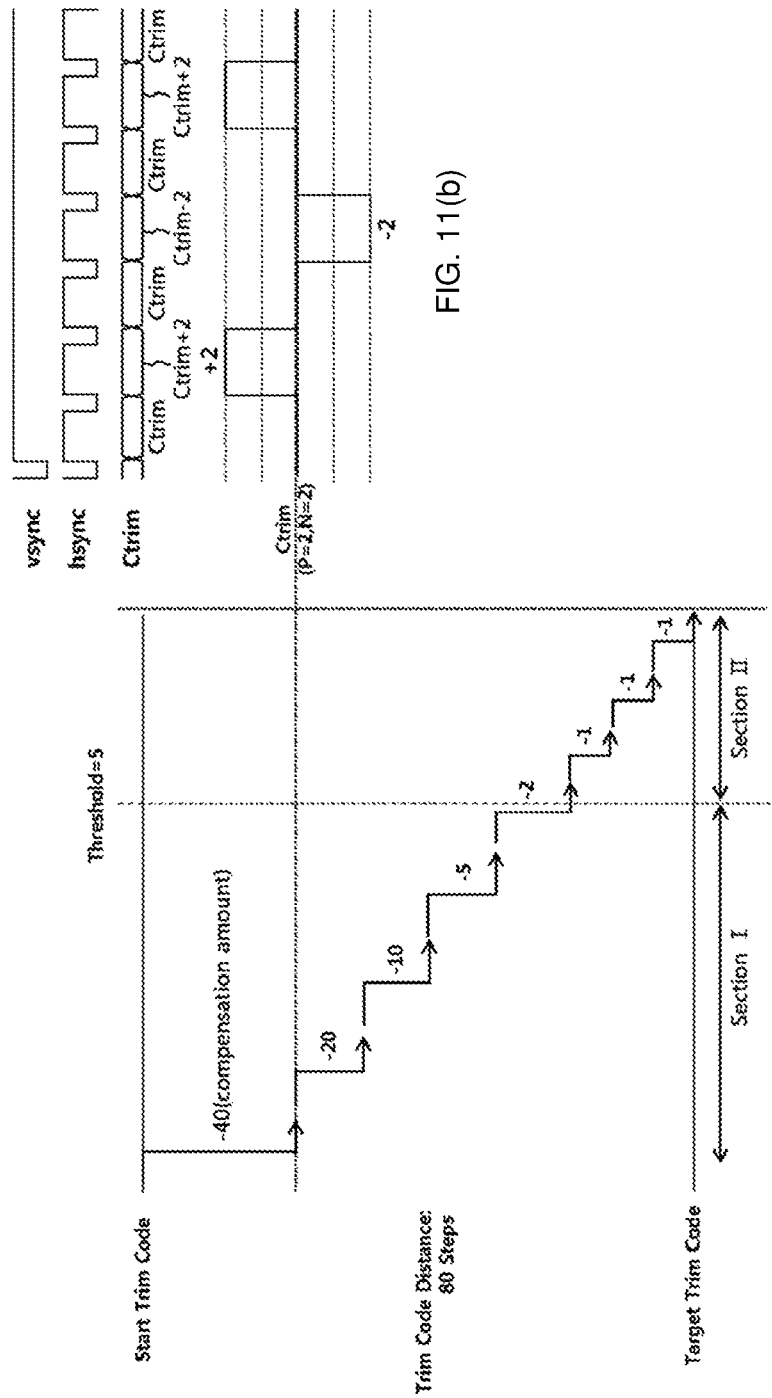

DISPLAY DRIVER IC INCLUDING OSCILLATOR FREQUENCY CONTROLLER

CROSS-REFERENCE TO RELATED APPLICATIONS

This application claims the benefit under 35 U.S.C. 119(a) of Korean Patent Application No. 10-2018-0101601 filed on Aug. 28, 2018 in the Korean Intellectual Property Office, the entire disclosure of which is incorporated herein by reference for all purposes.

BACKGROUND

1. Field

The present disclosure relates to a display driver IC including oscillator frequency controller.

2. Description of Related Art

A mobile electronic apparatus is desired to be multi-functional, consume low power, lighter, thinner, shorter, and smaller, in accordance with the demands of consumers. However, many components need to be integrated into a smaller area to meet such demands, and the operating frequency of the device is increased to a higher frequency band based on higher performing components.

As the frequency band of the operating frequency of components in the mobile electronic apparatus is increased, the mobile electronic apparatus becomes vulnerable electromagnetic interference between components and noise generation, which results in deterioration of the signal quality. For example, in the display driver IC, noise may be generated due to electromagnetic interference in an internal oscillator.

The internal oscillator of a display driver IC selects a specific frequency of the several frequency bands used in a mobile electronic device as an operating frequency. For example, the operating frequency may become a frame frequency of 60 Hz using an oscillator clock of an operating frequency when a display panel is driven.

However, when a frequency fixed by applying a trim code received from a register is used for the oscillator, multiples of a fixed frequency used for a predetermined intellectual property (IP) block may act as noise for peripheral components in some cases. For example, in the case of operating at a multiples of a frequency, the multiples of the frequency may act as noise on a particular frequency band deteriorating the signal quality of that frequency band due to electromagnetic interference. Further, when a frequency fixed by applying a trim code received from a register is used for the oscillator, if the temperature or voltage changes, the frequency, which depends on the characteristics of the oscillator may deviate from a target frequency.

In order to avoid the problems mentioned above, the operating frequency of the oscillator may be changed or a shield tape may be used to prevent electromagnetic interference.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a display driver IC includes a register map, an oscillator, a timing controller, an oscillator scatter, and an intellectual property (IP) block. The register map is configured to store a trim code of a fixed frequency and scatter option information. The oscillator is configured to generate an oscillator clock based on the trim code. The timing controller is configured to generate an internal synchronization signal based on the oscillator clock. The oscillator scatter is configured to output a modified trim code to the oscillator based on the trim code, the scatter option information, and the internal synchronization signal. The intellectual property (IP) block is configured to receive a modified oscillator clock generated in the oscillator based on the modified trim code.

The oscillator scatter may include an operation setter, an operation synchronizer, and a first calculator. The operation setter may be configured to select a calculating method based on the scatter option information and set a magnitude of the offset or interval information. The operation synchronizer may be configured to adjust the internal synchronization signal to a calculated synchronization signal based on the interval information and the oscillator clock. The first calculator may be configured to generate a result code to which the offset is applied based on the calculated synchronization signal responsive to the selected calculating method.

The oscillator scatter may be configured to output the result code as the modified trim code and may further include a disable code confirmer configured to output the result code as an available adjacent modified trim code upon the result code being a predetermined disable code.

In the modified trim code, a positive offset and a negative offset may be alternately generated for the trim code.

In the modified trim code, a positive offset may be periodically generated based on the trim code.

In the modified trim code, a negative offset may be periodically generated based on the trim code.

The operation synchronizer may be configured to output the calculated synchronization signal at n times of a cycle based on multiplication information of a cycle of the internal synchronization signal, wherein n is a numeric value.

The internal synchronization signal may be a horizontal synchronization signal, a vertical synchronization signal or a synchronization signal by a counter.

The multiplication information may include an integer data information and a decimal data information.

The multiplication information may include a plurality of bits representing an integer data information and a decimal data information. When the plurality of bits evaluates to zero, the calculated synchronization signal may be adjusted by a cycle based on an internal counter to be output.

In the modified trim code, a magnitude of a positive offset and a magnitude of a negative offset may be independently set in a compensation trim code to offset each other.

The modified trim code may include a first section in which a positive offset is applied to the trim code, a second section in which a negative offset is applied, and a third section in which no offset is applied, and the modified trim code may be generated at a predetermined number of repetitions with a synchronization signal selected for each of the first to third sections, as a unit.

In another general aspect, a display driver IC includes a register map, an oscillator, a timing controller, a DSI block, an oscillator frequency controller, and an intellectual property (IP) block. The register map is configured to store a trim code of a fixed frequency, a window size, a compensation option, and a scatter option information. The oscillator is configured to generate an oscillator clock based on the trim code. The timing controller is configured to generate an internal synchronization signal based on the oscillator clock. The DSI block is configured to output a data valid signal when an image data packet is received. The oscillator frequency controller includes a frequency compensating block configured to receive the oscillator clock and an oscillator scatter configured to output a modified trim code. The intellectual property (IP) block is configured to receive a modified oscillator clock from the oscillator based on the modified trim code. When an operating frequency deviates from a target frequency, the frequency compensating block generates a compensation trim code to compensate the operating frequency and the oscillator scatter generates the modified trim code by periodically applying a negative or positive offset within a range specified with respect to the compensation trim code, to the oscillator.

When the data valid signal is activated, the frequency compensating block may generate the compensation trim code in accordance with a result sign value output based on a difference obtained by comparing a periodic value of the oscillator clock signal with the target periodic value, a step distance, and the compensation option.

The oscillator scatter may include an operation setter, an operation synchronizer, a first calculator, and a disable code confirmer. The operation setter may be configured to select a calculating method in accordance with the scatter option information and may set a magnitude of the offset or interval information. The operation synchronizer may be configured to output a calculated synchronization signal obtained by applying multiplication information to the internal synchronization signal in accordance with the interval information and the oscillator clock. The first calculator may be configured to generate a result code to which the offset is applied based on the calculated synchronization signal responsive to the selected calculating method. The disable code confirmer may be configured to output the result code as the modified trim code, and when the result code is determined to be a predetermined disable code, may output the result code as an available adjacent modified trim code.

In the modified trim code, a positive offset and a negative offset may be alternately generated based on the compensation trim code.

In the modified trim code, a positive offset may be periodically generated based on the compensation trim code.

In the modified trim code, a negative offset may be periodically generated based on the compensation trim code.

In the modified trim code, a magnitude of a positive offset and a magnitude of a negative offset may be independently set in the compensation trim code to offset each other.

The multiplication information may include a plurality of bits representing an integer data information and a decimal data information, and when the plurality of bits evaluates to zero, the calculated synchronization signal is adjusted by a cycle based on an internal counter to be output.

In another general aspect, a display driver IC includes an oscillator, a timing controller, an oscillator frequency controller, and an intellectual property (IP) block. The oscillator is configured to generate an oscillator clock based on a trim code. The timing controller, connected to the oscillator, is configured to generate an internal synchronization signal based on the oscillator clock. The oscillator frequency controller, connected to the oscillator and the timing controller, is configured to receive the internal synchronization signal and generate a modified trim code to the oscillator.

When an operating frequency of the oscillator deviates from a target frequency, the oscillator frequency controller generates the modified trim code to comprise a negative offset and a positive offset based on the trim code. The intellectual property (IP) block, connected to the oscillator, is configured to receive a modified oscillator clock from the oscillator based on the modified trim code.

The trim code may include information on an operating frequency for driving a display panel.

The oscillator frequency controller may include a frequency compensating block and an oscillator scatter. The frequency compensating block may be configured to receive the oscillator clock and may generate a compensation trim code. The oscillator scatter may be configured to receive the compensation trim code, the internal synchronization signal, and a scatter option information, and generate the modified trim code.

The oscillator scatter may include an operation setter, an operation synchronizer, a first calculator, and a disable code confirmer. The operation setter may be configured to select a calculating method and may set a magnitude of the offset or interval information based on the scatter option information. The operation synchronizer may be configured to output a calculated synchronization signal based on the internal synchronization signal. The first calculator may be configured to generate a result code based on the calculated synchronization signal, the magnitude of the offset, and the interval information. The disable code confirmer may be configured to receive the result code and output the modified trim code, and when the result code is determined to be a predetermined disable code, may output the result code as an available adjacent modified trim code.

The frequency compensating block may include a compensation processor configured to compare a periodic value of the oscillator clock with a target periodic value and output the compensation trim code.

The display driver IC may further include a DSI block, connected to the frequency compensating block, configured to output a data valid signal when an image data packet is received. The frequency compensating block may compare a periodic value of the oscillator clock signal with a target periodic value, and may generate the compensation trim code based on the comparison result.

Other features and aspects will be apparent from the following detailed description, the drawings, and the claims.

BRIEF DESCRIPTION OF THE DRAWINGS

FIGS. 3(a) to 6(c) are operation timing charts according to examples of an oscillator scatter illustrated in FIG. 2.

FIGS. 9(a) and 9(b) are conceptual views for explaining an example of an FSM (Finite State Machine) illustrated in FIG. 8.

FIGS. 11(a) and 11(b) are operation timing charts according to an example of a display driver IC illustrated in FIG. 7.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION OF THE PREFERRED EMBODIMENT

Figure 1:
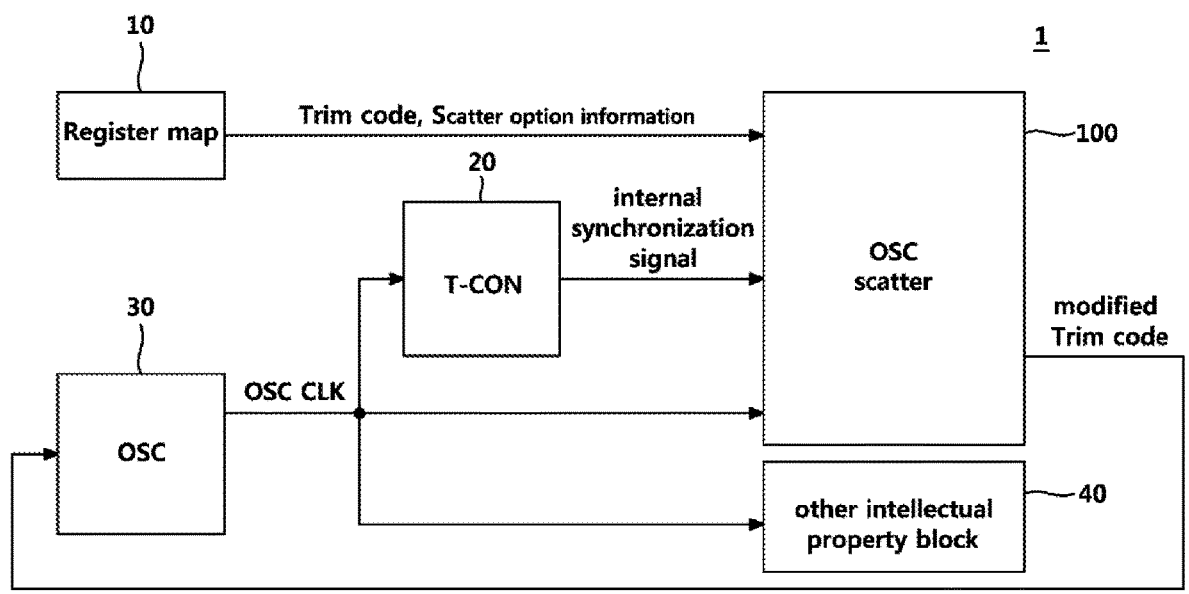
FIG. 1 is a block diagram illustrating an example of a display driver IC including an oscillator scatter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

One of the technical objectives to be achieved by the present disclosure is to provide a display driver integrated circuit (IC) that reduces a peak value of an electromagnetic interference (EMI) noise generated when a fixed frequency is used for the oscillator.

Further, another one of the technical objectives to be achieved by the present disclosure is to provide a display driver IC that scatters a noise spectrum of an operating frequency caused by the usage of a fixed frequency of the related art, while maintaining a target frequency.

Furthermore, another one of the technical objectives to be achieved by the present disclosure is to provide a display driver IC that operates at a target frequency insensitive to a temperature change, a voltage change, and a process change in accordance with the operation in a display driver IC.

FIG. 1 is a block diagram illustrating an example of a display driver IC, including an oscillator scatter.

Referring to FIG. 1, a display driver IC 1 includes a register map 10, a timing controller 20, an oscillator 30, an oscillator scatter 100, and an intellectual property (IP) block 40.

In one example, the display driver IC 1 of the present disclosure may be connected to a display panel. The display panel may be a thin film transistor liquid crystal display (TFT-LCD), a light emitting diode (LED) display, an organic LED (OLED) display, an active matrix OLED (AMOLED) display, or a flexible display.

The register map 10 may be a programmable memory that stores information required to adjust an operating frequency of the display driver IC and values for a scatter option information. The register map may be programmed by an application processor or programmed to be different from each other for every display driver IC. For example, the register map 10 may store information such as a trim code for a fixed frequency, a scatter option information, and/or a compensation option.

The timing controller 20 may generate an internal synchronization signal for driving a display panel connected to the display driver IC. In an example, the internal synchronization signal may be generated based on an oscillator clock and may include a horizontal synchronization signal and a vertical synchronization signal.

The oscillator 30 may generate an oscillator clock OSC CLK based on a trim code of the register map 10. The trim code may be information on an operating frequency for driving the display panel. For example, the trim code may be expressed by a complementary number of 2.

The oscillator scatter 100 may generate a modified trim code based on the trim code and the scatter option information stored in the register map, the oscillator clock OSC CLK from the oscillator, and the internal synchronization signal from the timing controller. That is, the oscillator scatter 100 may generate a modified trim code derived from a variation of the operating frequency by applying an offset within a range specified in a predetermined cycle unit with respect to the fixed frequency. The oscillator scatter 100 may output the modified trim code to the oscillator 30, and the oscillator 30 may generate a modified oscillator clock based on the modified trim code to supply the modified oscillator clock to the IP block 40.

The modified oscillator clock may apply a negative or positive offset to an original oscillator clock to cancel an original positive offset and negative offset with each other so that an average frame frequency of the oscillator clock applied with the negative or positive offset is equal to a frame frequency by the original oscillator clock. When the IP block 40 operates in accordance with the modified oscillator clock, which periodically varies by applying negative or positive offset with respect to the fixed frequency, the IP block 40 operates normally while maintaining the frame frequency of 60 Hz on average, and the noise spectrum is scattered by the varying frequency.

Figure 2:
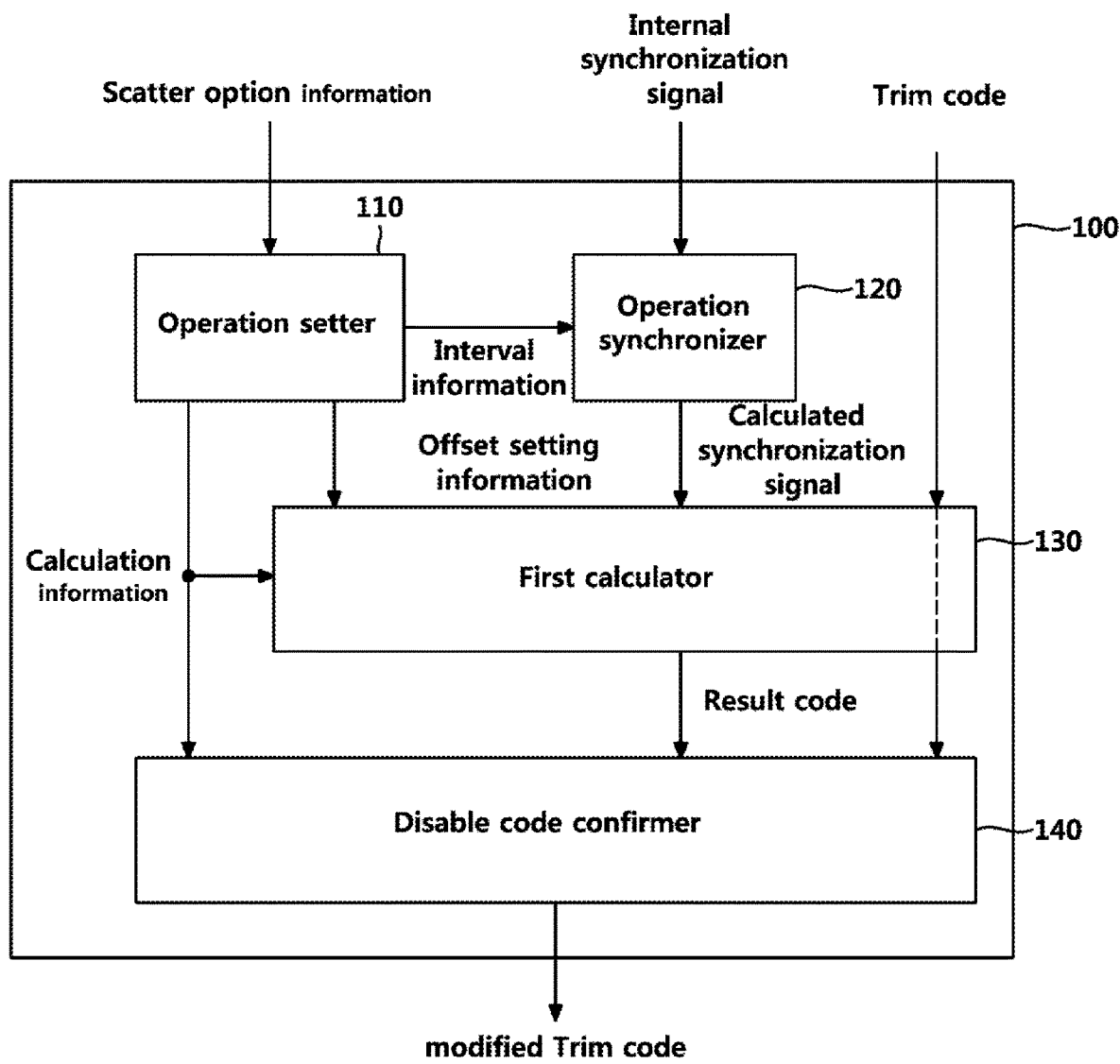
FIG. 2 is a block diagram illustrating an example of an oscillator scatter illustrated in FIG.

FIG. 2 is a block diagram illustrating an example of an oscillator scatter illustrated in FIG.

Referring to FIG. 2, according to an example, the oscillator scatter 100 includes an operation setter 110, an operation synchronizer 120, and a first calculator 130.

The operation setter 110 may select a calculating method based on the scatter option information and may set offset setting information for size or an interval. The operation setter 110 may transmit the interval information set in accordance with the scatter option information to the operation synchronizer 120. The operation setter 110 may transmit calculation information and offset setting information set in accordance with the scatter option information to the first calculator 130.

The operation synchronizer 120 may output a calculated synchronization signal at n times a cycle or period of the internal synchronization signal based on a multiplication information. That is, a cycle of the internal synchronization signal received from the timing controller 20 as a basic unit is increased or decreased by n times in accordance with the interval information received from the operation setter 110 to generate the calculated synchronization signal.

The multiplication information may include integer data information and decimal data information. The multiplication information may be configured by a plurality of bits. In one example, the multiplication information is 3 bits and the integer data information is set to be 2 bits, and the decimal data information is set to be 1 bit. In this example, it is assumed that two upper bits is the integer data information and the lower one bit is the decimal data information.

When both the integer data information and the decimal data information are 0, that is, 000, n=0 so that the operation synchronizer 120 uses an internal counter (not illustrated) independently from the internal synchronization signal.

If the multiplication information is 001, n=0.5 and the operation synchronizer 120 generates the calculated synchronization signal at 0.5 times of cycle of the selected internal synchronization signal. If the multiplication information is 010, n=1 and the calculated synchronization signal is generated at the same cycle as the selected internal synchronization signal. If the multiplication information is 011, n=1.5 and the calculated synchronization signal is generated at 1.5 times of cycle of the selected internal synchronization signal. If the multiplication information is 100, n=2 and the calculated synchronization signal is generated at two times of cycle of the selected internal synchronization signal. Similarly to the remaining bits (110 or 111), the cycle is multiplied to be generated.

For the convenience of description, even though the multiplication information is described as 3 bits, the present disclosure is not limited thereto, and it is obvious to those skilled in the art that setting of the bit number or the integer data information and the decimal data information for the multiplication information may vary depending on the setting.

The first calculator 130 may calculate the trim code received from the register map 10 in accordance with the calculated synchronization signal, the calculation information received from the operation setter 110, and/or the offset setting information to generate a result code to which offset is applied. The first calculator 130 may vary the magnitude or the cycle of the offset in accordance with the scatter option information and generate the result code to which the offset is applied, based on the calculated synchronization signal.

In an example, when it is determined that the result code is normal based on the calculation information, the first calculator 130 may select the result code as a modified trim code to output the result code. In an example, when it is determined that the result code is abnormal based on the calculation information, for example, if an overflow occurs, the result code may be limited to a positive upper limit, and if underflow occurs, the result code may be limited to a negative lower limit.

The oscillator scatter 100 may further include a disable code confirmer 140 according to another example.

When the result code corresponds to a predetermined disable code, the disable code confirmer 140 may convert the result code into an available adjacent modified trim code and may output the converted code. The disable code may be a trim code area which is not used in accordance with the implementation of the oscillator 30 and need to be avoided at the time of operating the oscillator. For example, when the trim code is 8 bits, a total of 256 trim codes may be included. In accordance with an implementation setting of the oscillator 30, when only 156 trim codes are available, the remaining 100 trim codes may correspond to disable codes.

FIGS. 3 to 6 are operation timing charts according to examples of an oscillator scatter illustrated in FIG. 2. Referring to FIGS. 3 to 6, according to an example, the oscillator scatter 100 may be synchronized with at least one selected from a horizontal synchronization signal hsync and a vertical synchronization signal vsync. The horizontal synchronization signal hsync and the vertical synchronization signal vsync are internal synchronization signals or synchronization signals generated at a predetermined interval by the counter setting to generate a modified trim code obtained by applying an offset to a trim code received from the register map. In this case, the operation setter may independently set a magnitude of the positive offset and a magnitude of the negative offset in accordance with the scatter option information. Further, in accordance with the scatter option information, the operation setter may generate a modified trim code output at a predetermined number of repetitions with a synchronization signal selected for each of a first section in which the positive offset is applied to the received trim code, a second section in which the negative offset is applied, and a third section in which no offset is applied as a unit.

The cycle may be adjusted such that the cycle of the section in which the positive offset is applied to the modified trim code is shorter than the cycle of the section in which no offset is applied, and the cycle of the section in which the negative offset is applied is longer than the cycle of the section in which no offset is applied. When the modified trim code to which the positive offset is applied is converted into an oscillator clock, the modified trim code may have a frequency higher than the target frequency by the offset. When the modified trim code to which the negative offset is applied is converted into an oscillator clock, the modified trim code may have a frequency lower than the target frequency by the offset. Therefore, in order to scatter the noise spectrum while maintaining the target frequency, the length of sections may be adjusted in accordance with the type of the offset (a positive offset, a negative offset, or zero offset).

Figure 3A:
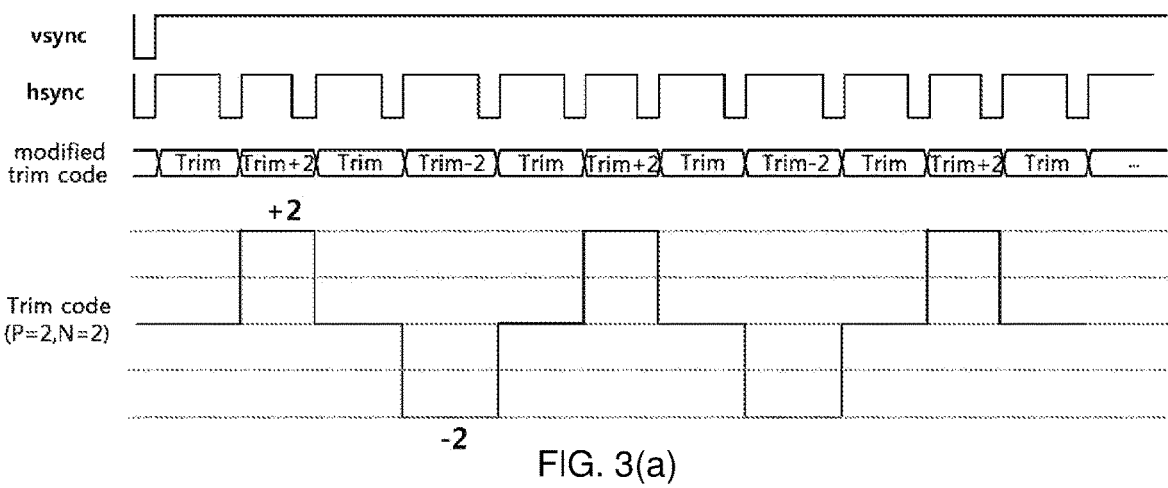

As illustrated in FIG. 3(a), the oscillator scatter 100 is synchronized with the horizontal synchronization signal to generate a modified trim code (P=2 and N=2) in which the positive offset (P=2) and the negative offset (N=2) are alternately generated, by applying a scatter option information to the trim code received from the register map. In the modified trim code for every offset applying section, the cycle of the first section in which the positive offset of the modified trim code is applied is shorter than the cycle of the third section in which no offset is applied. Further, the cycle of the second section in which the negative offset of the modified trim code is applied is longer than the cycle of the third section in which no offset is applied.

Figure 3B:
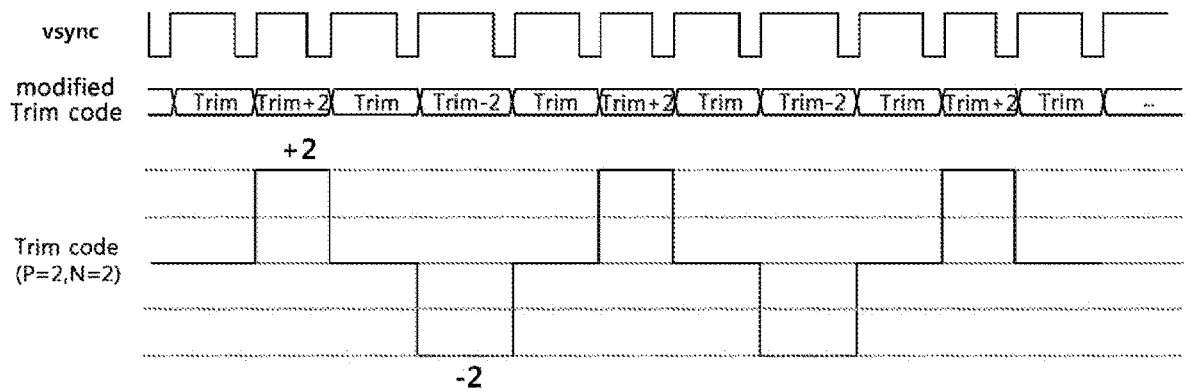

Alternatively, as illustrated in FIG. 3(b), the oscillator scatter 100 is synchronized with the vertical synchronization signal vsync to generate a modified trim code (P=2 and N=2) in which the positive offset (P=2) and the negative offset (N=2) are alternately generated, by applying a scatter option information to the trim code received from the register map.

Similarly, unit lengths (cycles) for every section of the modified trim code are increased in the order of the first section in which the positive offset is applied, the third section in which no offset is applied, and the second section in which the negative offset is applied.

Figure 4:
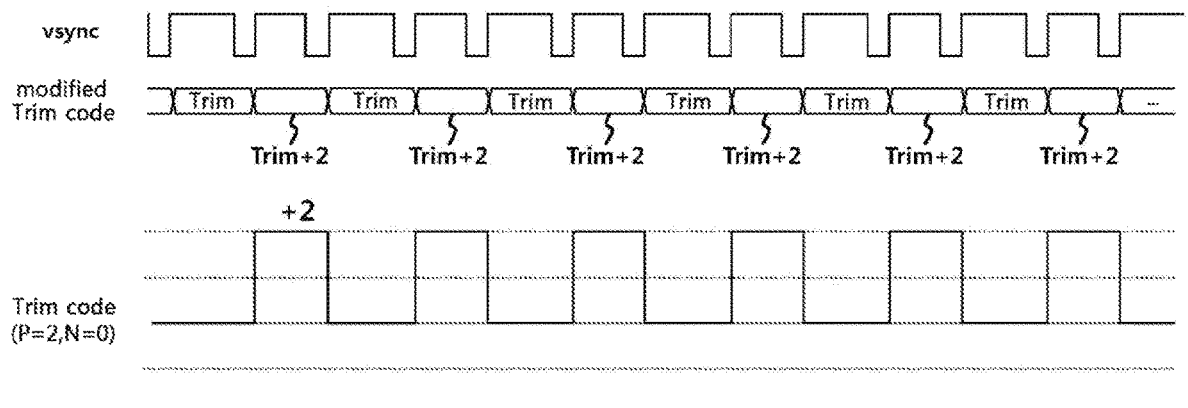

As illustrated in FIG. 4, the oscillator scatter 100 may be synchronized with the internal synchronization signals and may generate a modified trim code (P=2) in which the positive offset (P=2) is periodically generated, by applying a scatter option information to the trim code received from the register map. In this case, an average frame frequency of the trim code may have a higher value than that of the fixed frequency but may be applied to be set as a higher value than that of the fixed frequency of the oscillator clock depending on a set situation where the display panel is used. That is, it is possible to prevent the frame frequency from dropping below 60 Hz.

Figure 5:
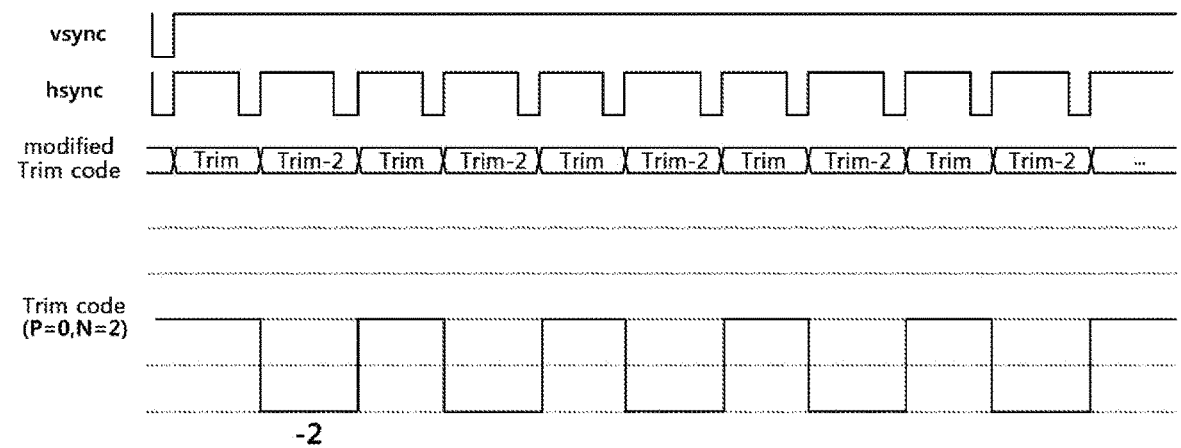

As illustrated in FIG. 5, the oscillator scatter 100 may be synchronized with the internal synchronization signals and may generate a modified trim code (N=2) in which the negative offset (N=2) is periodically generated, by applying a scatter option information to the trim code received from the register map. In this case, an average frame frequency of the trim code may have a lower value than that of the fixed frequency but may be applied to be set as a lower value than that of the fixed frequency of the oscillator clock depending on a set situation where the display panel is used. That is, the oscillator frequency is slightly lowered to save power consumption.

Figure 6:
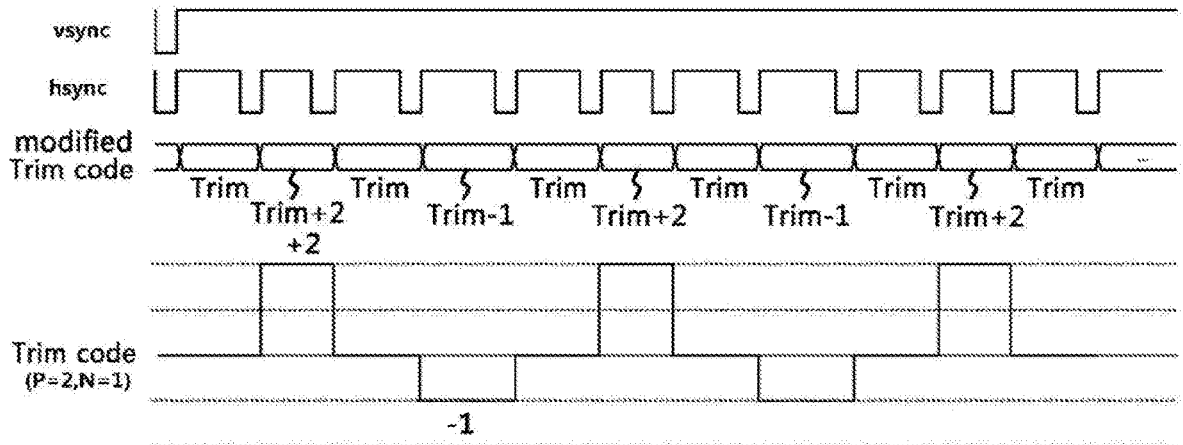
Figure 6:
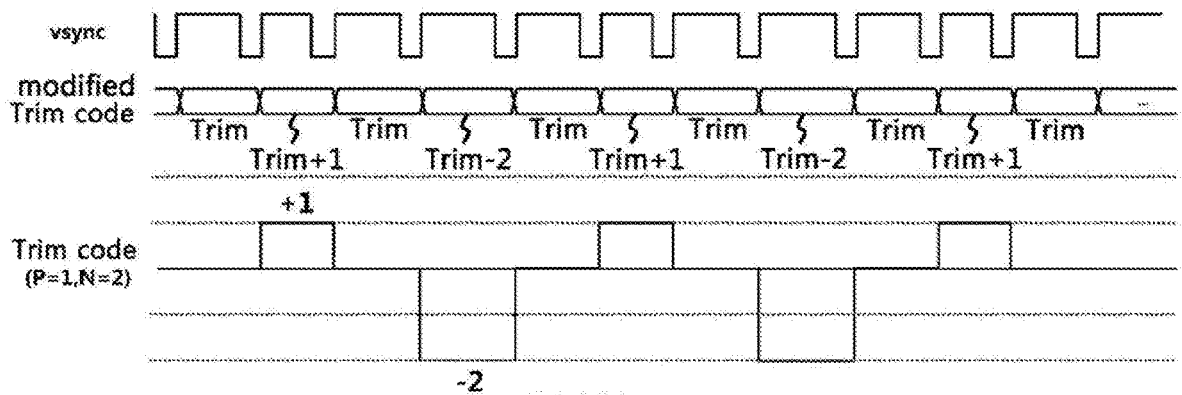
Figure 6:
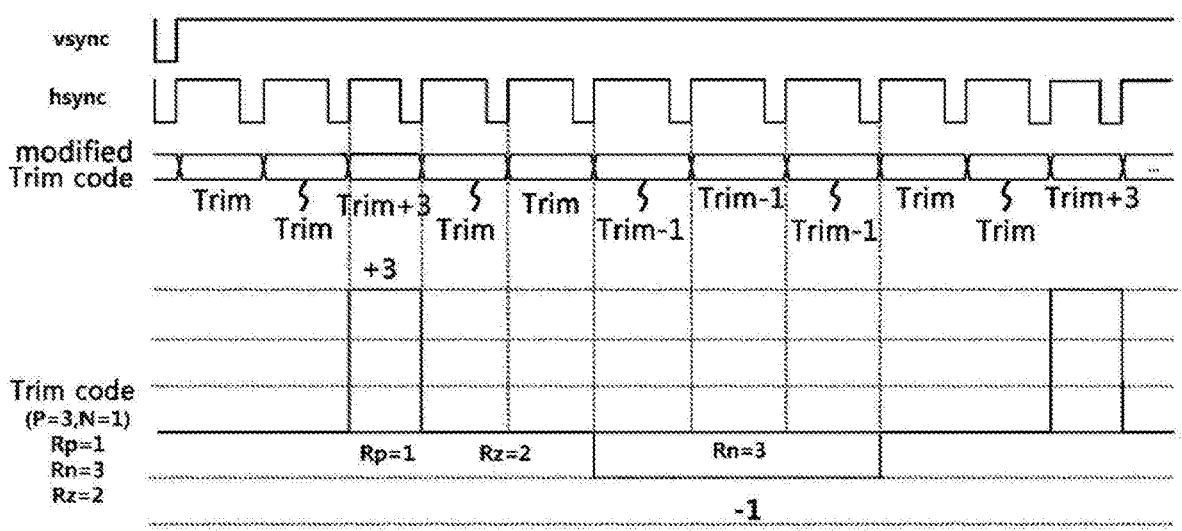

As illustrated in FIG. 6, the oscillator scatter 100 may be synchronized with the internal synchronization signals and may generate modified trim codes which are alternately generated by applying the scatter option information to the trim code received from the register map and independently setting the positive offset and the negative offset.

For example, as illustrated in FIG. 6(a), the offsets may be alternated such that the positive offset is increased by two units, and the negative offset is decreased by one unit (P=2 and N=1).

As another example, as illustrated in FIG. 6(b), the offsets may be alternated such that the positive offset is increased by one unit, and the negative offset is decreased by two units (P=1 and N=2).

As still another example, as illustrated in FIG. 6(c), a modified trim code output at a predetermined number of repetitions may be generated with a synchronization signal selected for each of a first section in which the positive offset is applied to the received trim code, a second section in which the negative offset is applied, and a third section in which no offset is applied, as a unit. To be more specific, with the synchronization signal selected for the modified trim code as a unit, the first section to which the positive offset is applied is repeated Rp times, the second section to which the negative offset is applied is repeated Rn times, and the third section in which no offset is applied is repeated Rz times. In FIG. 6(c), it is illustrated that a section to which an offset of +3 is applied is repeated one time, a section to which an offset of −1 is applied is repeated three times, and a section to which no offset is applied is repeated two times.

In this example, the horizontal synchronization signal or the vertical synchronization signal of FIGS. 3 to 6 are selected in accordance with the scatter option information. The selected internal synchronization signal is calculation synchronization information to which n times of cycle is applied in accordance with the interval information received from the operation setter and is applied to generate the modified trim code. The multiplication information may be formed of a plurality of bits and may include integer data information and decimal data information.

For example, it is assumed that the multiplication information is 3 bits and an integer data information is set to be 2 bits, and a decimal data information is set to be 1 bit. That is, it is assumed that two upper bits are the integer data information and one lower bit is the decimal data information.

When the multiplication information is 000, n=0 and the operation synchronizer 120 uses the internal counter, independently from the internal synchronization signal. If the multiplication information is 001, n=0.5 and the operation synchronizer 120 generates the calculated synchronization signal as 0.5 times of cycle of the selected internal synchronization signal. If the multiplication information is 010, n=1, and the calculated synchronization signal is generated to have the same cycle as the selected internal synchronization signal. If the multiplication information is 011, n=1.5, and the calculated synchronization signal is generated to have 1.5 times of cycle of the selected internal synchronization signal. If the multiplication information is 100, n=2, and the calculated synchronization signal is generated to have 2 times of cycle of the selected internal synchronization signal. Similarly to the remaining bits (110 or 111), the cycle is multiplied to be generated. The degree of multiplication may be differently applied depending on the operation setting of the display driver IC.

For the convenience of description, even though the multiplication information is described as 3 bits, the present disclosure is not limited thereto, and it is obvious to those skilled in the art that the bit number or the setting of the integer data information and the decimal data information for the multiplication information may vary depending on the setting.

In FIGS. 3 to 6, the magnitude of the offset is illustrated as integers such as −1, +1, or −2 or +2, but the values are unit values for illustrative purpose, and the scope of the present disclosure is not limited thereto and may be a specified value according to various examples.

As described above, the oscillator scatter may periodically change the frequency in a range specified with respect to the target frequency to scatter the noise spectrum.

The oscillator scatter of the present disclosure may reduce an EMI peak value by scattering the noise spectrum.

A display driver IC, including the oscillator scatter of the present disclosure reduces the EMI peak value so that the signal quality of the mobile electronic apparatus is not deteriorated.

However, when an environment where the oscillator operates is changed in accordance with the temperature change and the voltage change, there may be a problem in that the operating frequency is changed by the characteristic of the oscillator 30 to deviate from the target frequency. To solve the above-mentioned problem, the display driver IC, which further includes a frequency compensating block of FIG. 7 will be described.

Figure 7:
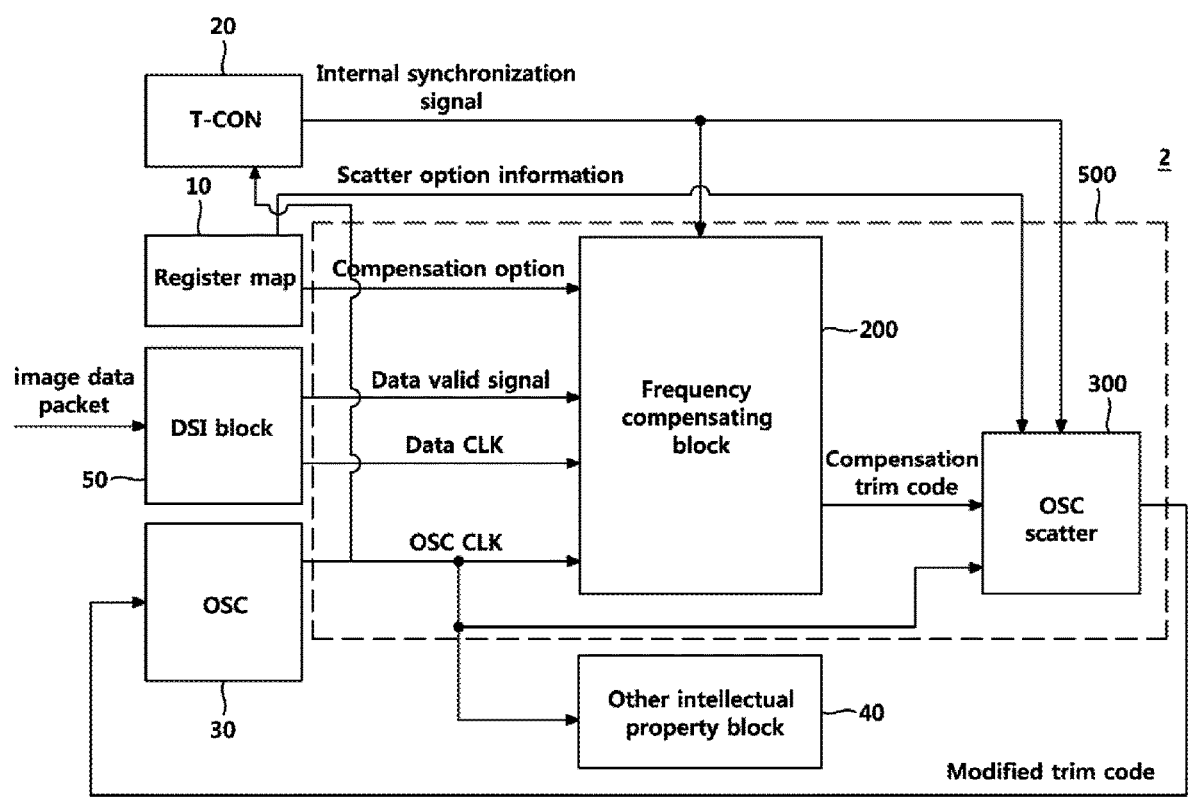
FIG. 7 is a block diagram illustrating another example of a display driver IC including an oscillator frequency controller.

FIG. 7 is a block diagram illustrating a display driver IC, including an oscillator frequency controller according to another example of the present disclosure. For the convenience of description, the difference from FIG. 1 will be mainly described.

Referring to FIG. 7, the display driver IC 2 includes a register map 10, a timing controller 20, an oscillator 30, an IP block 40, a DSI block 50, and an oscillator frequency controller 500.

The register map 10 may store a trim code, which becomes a foundation for generating an operating frequency, information (for example, a resolution or a window size) on a display panel, a compensation option, and scatter option information.

The timing controller 20 may generate an internal synchronization signal. The internal synchronization signal may include a vertical synchronization signal and a horizontal synchronization signal.

The oscillator 30 may generate an oscillator clock OSC CLK in accordance with the trim code. The trim code may be information on an operating frequency for driving the display panel. For example, the trim code may be expressed by a complementary number of 2.

The IP block 40 may perform a predetermined function based on the oscillator clock received from the oscillator. For example, the IP block 40 may be used to drive the display driver IC.

The DSI block 50 may receive image data packet from a host to output a data valid signal and a data clock CLK.

When the fixed frequency is deviated from the target frequency in accordance with application of the trim code received from the register map, due to a temperature change, a voltage change, and/or a process change when driving of the display, the oscillator frequency controller 500 may periodically apply positive or negative offset to the trim code compensated for noise spectrum scattering within a predetermined range while performing a frequency compensating operation to be operated at the target frequency again. The oscillator frequency controller 500 includes a frequency compensating block 200, and an oscillator scatter 300.

When the operating frequency in accordance with the trim code received from the register map is deviated from the target frequency, the frequency compensating block 200 compensates the operating frequency with the target frequency again. To be more specific, when the data valid signal is activated by receiving the image data packet, the frequency compensating block 200 compares the current operating frequency, that is, a periodic value of the oscillator clock signal with a target periodic value and may generate a compensation trim code in accordance with the comparison result and the selected compensation option. The compensation option includes a step adjusting option, a threshold value setting option, and a current code selecting option.

The oscillator scatter 300 may receive the compensation trim code from the frequency compensating block 200 to generate a modified trim code obtained by periodically applying positive or negative offset within a range specified with respect to the compensation trim code, based on the scatter option information, the internal synchronization signal, and/or the oscillator clock to output the modified trim code to the oscillator 30.

Figure 8:
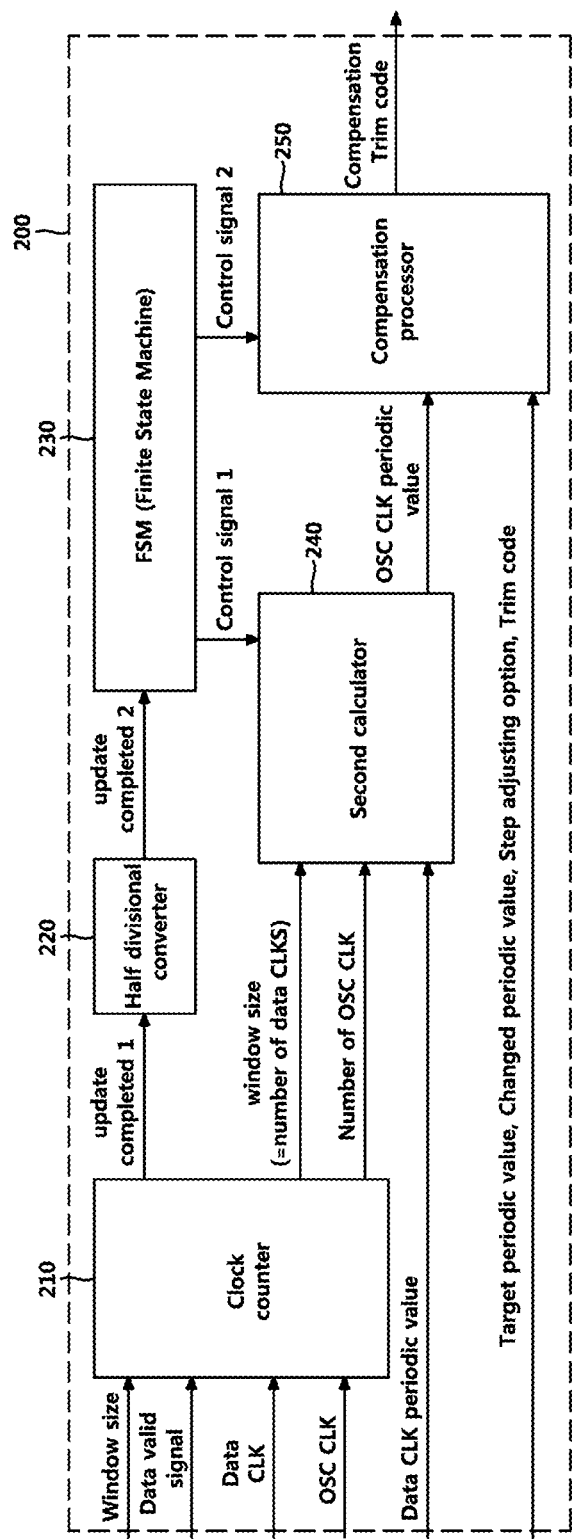
FIG. 8 is a block diagram illustrating an example of a frequency compensating block illustrated in FIG. 7.
Figure 10:
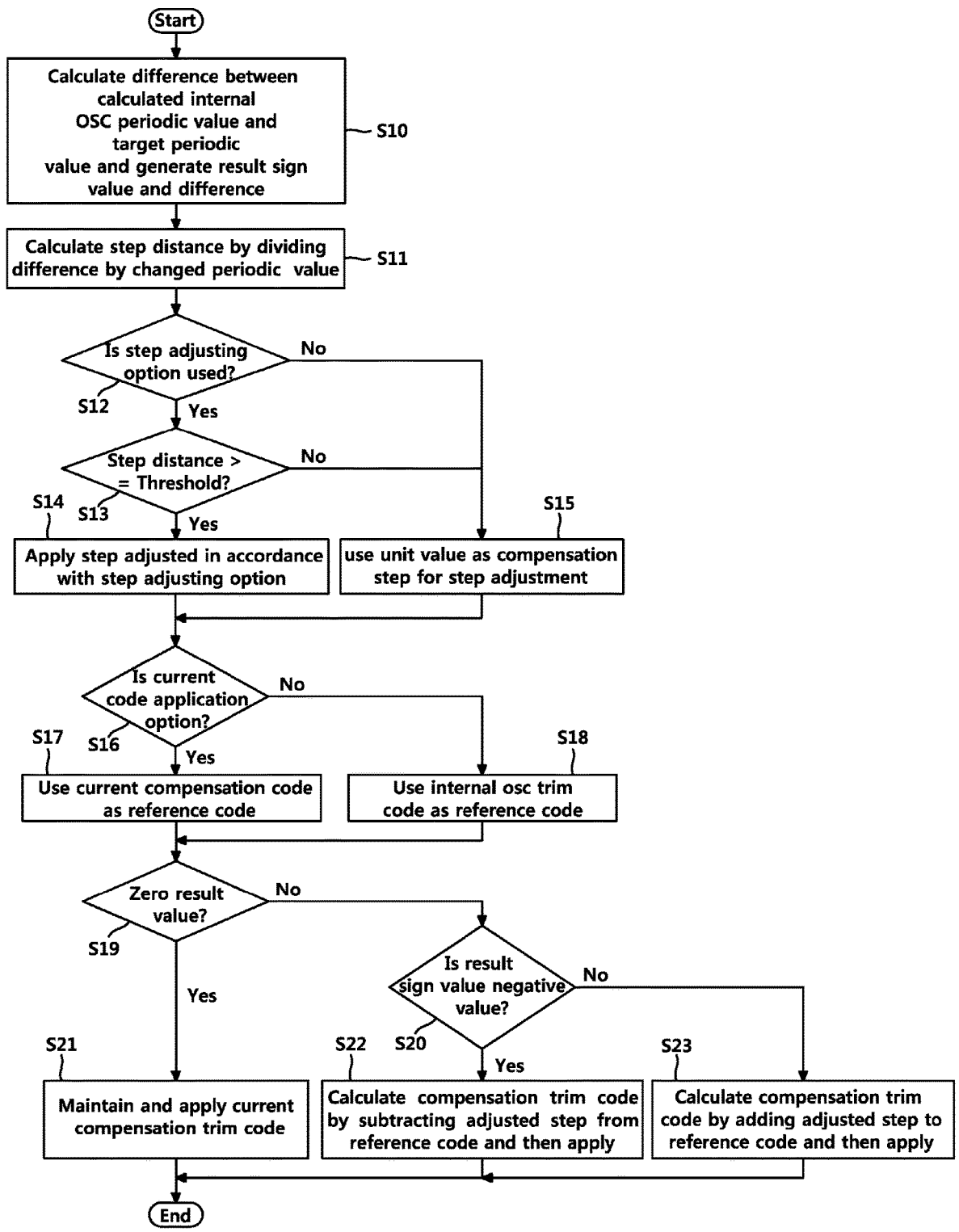
FIG. 10 is a flow chart for explaining an example of a compensation processor illustrated in FIG. 8.

FIG. 8 is a block diagram illustrating an example of a frequency compensating block illustrated in FIG. 7, FIGS. 9(a) and 9(b) are conceptual views for explaining an example of a FSM (Finite State Machine) illustrated in FIG. 8, and FIG. 10 is a flow chart for explaining an example of a compensation processor illustrated in FIG. 8.

Referring to FIG. 8, the frequency compensating block 200 includes a clock counter 210, a half-divisional converter 220, an FSM (Finite State Machine) 230, a second calculator 240, and a compensation processor 250.

When the data valid signal is activated due to the image data packet update, the clock counter 210 receives window size information from the register map and synchronizes the data valid signal with an oscillator clock domain (clock domain crossing: hereinafter, abbreviated as CDC), and then counts the signal by an oscillator clock to sample the number of oscillator clocks.

A half-divisional converter 220 may divide an oscillator clock at the time of performing an operation to generate a compensation trim code. In the illustrated example, the oscillator clock is divided into two, but according to various examples, the oscillator clock may be divided into M (M is a natural number). The half-divisional converter 220 may output a second update completion signal obtained by dividing a first update completion signal generated when image data packet corresponding to a window size from the host of the clock counter 210 is completely updated, into two.

The FSM (Finite State Machine) 230 may be synchronized with the internal synchronization signal to determine whether to perform the frequency compensation operation while changing the state. Specifically, with reference to FIG. 9(a), according to an example, the FSM (Finite State Machine) 230 includes an idle state, a wait state, a ready state, a calculating state (Calcu state), and an apply state.

In the idle state, the frequency compensating operation is disabled. When the FSM (Finite State Machine) enters an undefined state during a finite state machine (FSM) operation, a next state becomes an idle state.

The wait state is a state waiting until an update completion signal in accordance with the reception completion of image data packet corresponding to the window size is generated after starting the update of the image data packet.

The ready state is a state, which the FSM (Finite State Machine) 230 enters as soon as the update completion signal in accordance with the image data packet update completion is generated in the wait state.

In the calculating state, the oscillator frequency cycle is calculated, and the frequency compensating operation is performed, and the compensation trim code is calculated in accordance with the compensation option.

In the apply state, the compensation trim code synchronized with the internal synchronization signal to be calculated is applied and stabilized, and then it enters the wait state.

Referring to FIG. 9(b), a table representing an application effect in accordance with an entering option of the wait state and the apply state. According to an option 1 of a first row of the table, in order to enter from the apply state to the wait state, the FSM (Finite State Machine) 230 is synchronized with the vertical synchronization information vsync to perform the frequency compensating operation and the stabilization is applied for one frame. Similarly, according to an option 2 of a first row of the table, in order to enter from the calculating state to the apply state, the FSM (Finite State Machine) 230 is synchronized with the vertical synchronization information vsync to perform the frequency compensating operation and the compensation trim code is stabilized for one frame. As a result, the compensation trim codes are not mixed for one frame.

According to an option 1 of a second row of the table, in order to enter from the apply state to the wait state, the FSM (Finite State Machine) 230 is synchronized with the vertical synchronization information vsync to perform the frequency compensating operation and the stabilization is applied for 1H or more. Similarly, according to an option 2 of the second row of the table, in order to enter from the calculating state to the apply state, the FSM (Finite State Machine) 230 is synchronized with the horizontal synchronization information hsync to perform the frequency compensating operation and stabilization of the compensation trim code is applied for 1H or more. As a result, the compensation trim codes may be mixed for one frame.

According to an option 1 of a third row of the table, in order to enter from the apply state to the wait state, the FSM (Finite State Machine) 230 is synchronized with the horizontal synchronization information hsync to perform the frequency compensating operation, and the stabilization is applied for 1H or more. Similarly, according to an option 2 of the third row of the table, in order to enter from the calculating state to the apply state, the FSM (Finite State Machine) 230 is synchronized with the vertical synchronization information vsync to perform the frequency compensating operation and stabilization is applied for 1H or more. As a result, the compensation trim codes are not mixed for one frame.

According to an option 1 of a fourth row of the table, in order to enter from the apply state from the wait state, the FSM (Finite State Machine) 230 is synchronized with the horizontal synchronization information hsync to perform the frequency compensating operation, and the stabilization is applied for 1H. Similarly, according to an option 2 of the fourth row of the table, in order to enter from the calculating state to the apply state, the FSM (Finite State Machine) 230 is synchronized with the horizontal synchronization information hsync to perform the frequency compensating operation and stabilization is applied for 1H. As a result, the compensation trim codes may be mixed for one frame.

The FSM (Finite State Machine) 230 may transmit a first control signal and a second control signal in accordance with each option illustrated in the table of FIG. 9B to the second calculator 240 and the compensation processor 250.

The second calculator 240 may determine whether to perform the arithmetic operation to calculate the oscillator clock cycle and compensate the frequency, in accordance with the first control signal. The compensation processor 250 may determine whether to output the compensation trim signal in accordance with the second control signal.

In one example, the second calculator 240 calculates a periodic value of the oscillator clock which is supplied at a current operating frequency based on the periodic value of the data clock, the window size (=the number of data clocks), and the number of oscillator clocks.

In one example, the compensation processor 250 compares the periodic value of the oscillator clock calculated in the second calculator 240 with a target periodic value read from the register map 10. A compensating direction may be determined based on a result sign value of a difference between the periodic value of the oscillator clock and the target periodic value as a comparison result, and a compensation trim code may be generated in accordance with the compensation option. Here, the difference is obtained by subtracting the target periodic value from the oscillator clock periodic value and is a value for a time. The compensating direction may refer to a direction indicating whether to increase or decrease the currently calculated oscillator clock periodic value, based on the target periodic value. The compensation option may determine the size of the adjusting step in accordance with the magnitude of the difference.

Referring to FIG. 10, the compensation processor 250 may compare the periodic value of the oscillator clock with the target periodic value to generate a result sign value and a difference value in step S10. The difference value may be divided by the changed periodic value read from the register map to calculate a step distance in step S11. In this case, the step distance is an absolute value of a value obtained by subtracting the current trim code from the target trim code, and a unit thereof is a trim code unit step. The current trim code is a start trim code which is read from the register map by the oscillator. It is confirmed whether to use the step adjusting option based on the step distance in step S12 and when the step distance is larger than a predetermined threshold value in step S13, it is selected to use a step adjusted in accordance with the step adjusting option. When the step distance is smaller than the threshold value in step S13, a unit value step (for example, one unit) is selected in accordance with the step adjusting option.

The compensation processor 250 may determine a reference code for calculating a compensation trim code in accordance with the current code applying option. The current code applying option is selected when the target frequency is dynamically changed in accordance with the temperature. In the case of the current code applying option in step S16, the current compensation trim code is used; otherwise, a trim code provided from the register map is used as a code to be compensated in step S18. That is, the current compensation code is used to restrict so as not to be significantly deviated from the trim code provided from the register map.

The compensation processor 250 may calculate a compensation trim code by applying a compensation amount to the reference code in step S17 or 18. When the calculated compensation trim code is a zero result value in step S19, the compensation processor maintains the current compensation trim code as it is without applying the calculated compensation trim code. When the calculated compensation trim code is not the zero result value in step S19, the compensation processor 250 confirms whether the result sign value of the calculation is a positive value or a negative value in step S20. When the result sign value is a negative value, the compensation trim code is generated by subtracting the adjusted step from the reference code in step S22. When the result sign value is a positive value, the compensation trim code is generated by adding the adjusted step to the reference code in step S23.

The compensation processor 250 may determine whether to output the compensation trim signal in accordance with the second control signal of the FSM (Finite State Machine) 230.

FIGS. 11(*a*) and (*b*) are operation timing charts according to an example of a display driver IC illustrated in FIG. 7. FIGS. 12(*a*) and (*b*) are operation timing charts according to another example of a display driver IC illustrated in FIG. 7.

It is assumed that the compensating direction between the trim code (start trim code) of the calculated oscillator clock and a trim code (target trim code) in accordance with the target frequency, that is, the result sign value is negative, and the step distance is 80 steps. It is assumed that the threshold value is five steps.

Referring to FIG. 11(a), in the case of section I in which the step distance (80 steps) is larger than a predetermined threshold value (5 steps), the adjusted step may be set to be a value obtained by dividing the difference value into four, a value obtained by dividing the difference value into two, and a value obtained by dividing the difference value into one and so on, in accordance with the step adjusting option. As illustrated in the drawing, when the adjusted step is compensated in a negative direction by 40 steps which are the half step distance (80 steps) due to the image data packet update, the distance is reduced to be 40 steps. Next, the adjusted step is compensated by a half 40 steps, which is the remaining distance value, that is, 20 steps, in a negative direction, due to the image data packet update. Similarly, when the compensation is gradually performed to reach the section II where an interval between the adjusted trim code and the target trim code becomes smaller than the threshold value, the step adjusting option is changed to be compensated in a negative direction by the unit step 1. When this process is repeated, the compensation trim code which is compensated by an adjusted step in the trim code (start trim code) of the oscillator clock calculated due to the image data packet update is converted to be close to the trim code (target trim code) in accordance with the target frequency.

Figures 12A, 12B:
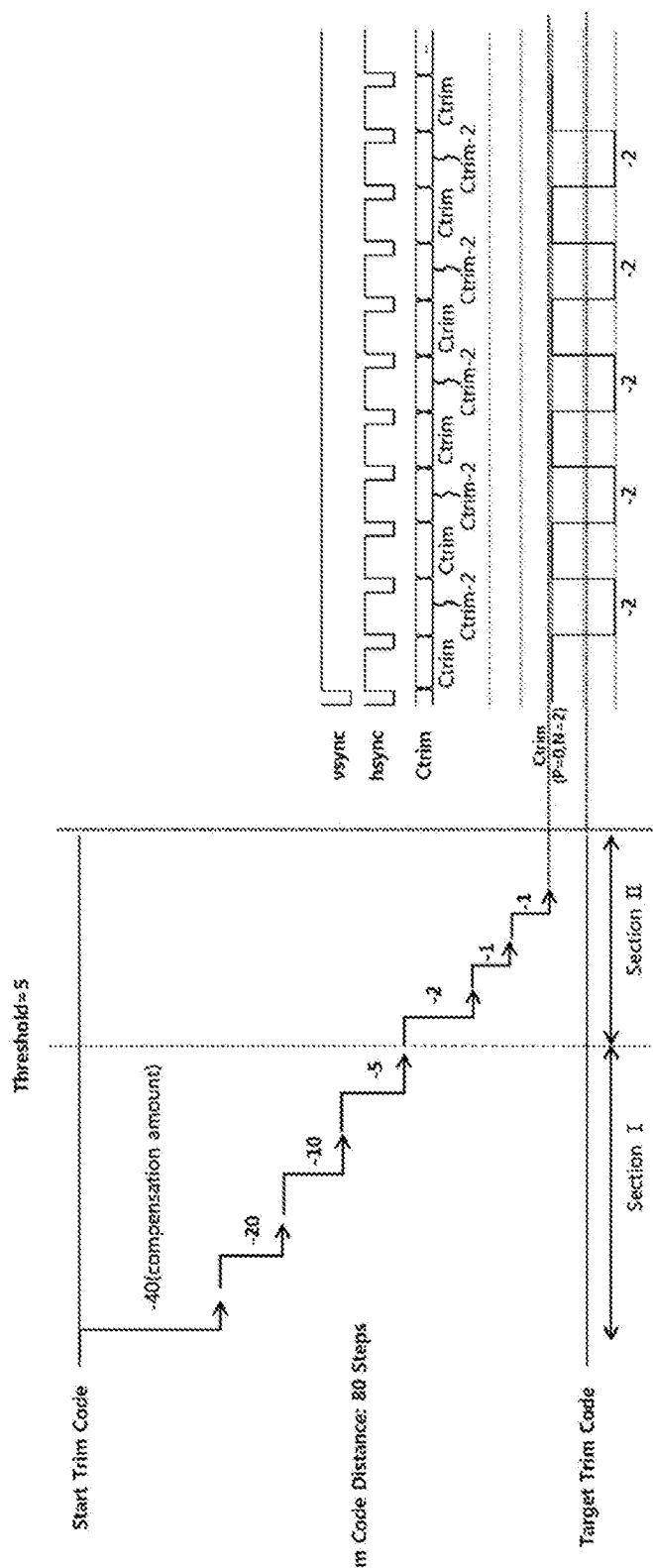
FIGS. 12(a) and 12(b) are operation timing charts according to another example of a display driver IC illustrated in FIG. 7.

Referring to FIG. 12(a), the oscillator scatter applies positive or negative offset to intend to cancel the positive offset and the negative offset with each other. However, due to the actual implementation characteristics of the oscillator, in some cases, the frequency variation between adjacent codes of the entire trim code is not constant.

For example, even though positive or negative offset with the same magnitude is designated, the positive offset and the negative offset are not cancelled with each other in some cases. In this case, when the frequency compensating block is used, a compensation trim code which may cancel positive or negative offset by the oscillator scatter may be generated. In this case, the frequency compensating block identifies the average frequency by the negative offset of the oscillator scatter to perform the compensation and converges on the target trim code by erroneous aiming in the frequency compensating block.

As a result, when the operating frequency is changed to a value deviated from the target frequency in accordance with the trim code provided from the register map, due to the temperature change, the voltage change, and the process change and so on, in accordance with the display driving, the operating frequency may be adjusted to the target frequency again by the frequency compensation as described above.

The oscillator scatter 300 periodically applies positive or negative offset within a range specified with respect to the compensation trim code by applying the offset to the compensation trim code to vary the frequency. Referring to FIG. 11(b), the compensation trim code compensated by the adjusted step is input to the oscillator scatter 300 to be calculated as a modified trim code in accordance with the offset setting in accordance with the scatter option information.

As described above, according to an example, the modified trim code (Ctrim P=2 and N=2) may have a form in which a positive offset and a negative offset are alternately generated with respect to the compensation trim code. According to another example, the modified trim code may be a code in which the positive offset is periodically generated with respect to the compensation trim code, and according to still another example, the modified trim code may be a code in which the negative offset is periodically generated with respect to the compensation trim code. According to still another example, the modified trim code may be a code in which the positive offset and the negative offset are independently set to be alternately generated as offsets having different magnitudes. Further, according to still another example, a modified trim code may be output at a predetermined number of repetitions with a synchronization signal selected for each of a first section in which the positive offset is applied to the received trim code, a second section in which the negative offset is applied, and a third section in which no offset is applied, as a unit, to be generated.

The display driver IC, including an oscillator frequency controller as described above, may operate at a target frequency insensitive to the temperature change, the voltage change, or the process change in accordance with the operation.

The oscillator scatter of the display driver IC of the present disclosure may periodically change the frequency in a range specified with respect to the target frequency to scatter the noise spectrum.

The oscillator scatter of the display driver IC of the present disclosure may scatter the noise spectrum of the internal oscillator to reduce the EMI peak value.

The oscillator scatter of the display driver IC of the present disclosure may reduce the EMI peak value by the internal oscillator so that the signal quality of the mobile electronic apparatus is not deteriorated.

The display driver IC, including an oscillator frequency controller of the present disclosure may operate at a target frequency insensitive to the temperature change, the voltage change, or the process change in accordance with the operation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A display driver IC, comprising:
  a register map configured to store a trim code of a fixed frequency and scatter option information;
  an oscillator configured to generate an oscillator clock based on the trim code;
  a timing controller configured to generate an internal synchronization signal based on the oscillator clock;
  an oscillator scatter configured to output a modified trim code to the oscillator based on a negative offset or a positive offset in the trim code, the scatter option information, and the internal synchronization signal; and an intellectual property (IP) block is configured to receive a modified oscillator clock generated in the oscillator based on the modified trim code.

2. The display driver IC of claim 1, wherein the oscillator scatter comprises:
an operation setter configured to select a calculating method based on the scatter option information and set a magnitude of the negative offset or the positive offset, or interval information;
an operation synchronizer configured to adjust the internal synchronization signal to a calculated synchronization signal based on the interval information and the oscillator clock; and
a first calculator configured to generate a result code to which the negative offset or the positive offset is applied based on the calculated synchronization signal responsive to the selected calculating method.

3. The display driver IC of claim 2, wherein the oscillator scatter is configured to output the result code as the modified trim code and further comprises a disable code confirmer configured to output the result code as an available adjacent modified trim code upon the result code being a predetermined disable code.

4. The display driver IC of claim 2, wherein the operation synchronizer is configured to output the calculated synchronization signal at n times of a cycle based on multiplication information of a cycle of the internal synchronization signal, wherein n is a numeric value.

5. The display driver IC of claim 4, wherein the multiplication information comprises an integer data information and a decimal data information.

6. The display driver IC of claim 4, wherein the multiplication information comprises a plurality of bits representing an integer data information and a decimal data information, and
when the plurality of bits evaluates to zero, the calculated synchronization signal is adjusted by a cycle based on an internal counter to be output.

7. The display driver IC of claim 1, wherein in the modified trim code, the positive offset and the negative offset are alternately generated based on the trim code.

8. The display driver IC of claim 1, wherein in the modified trim code, the positive offset is periodically generated based on the trim code.

9. The display driver IC of claim 1, wherein in the modified trim code, the negative offset is periodically generated based on the trim code.

10. The display driver IC of claim 1, wherein the internal synchronization signal is a horizontal synchronization signal, a vertical synchronization signal or a synchronization signal.

11. The display driver IC of claim 1, wherein in the modified trim code, a magnitude of the positive offset and a magnitude of the negative offset are independently set in a compensation trim code to offset each other.

12. The display driver IC of claim 1, wherein the modified trim code comprises a first section in which the positive offset is applied to the trim code, a second section in which the negative offset is applied, and a third section in which no offset is applied, and the modified trim code is generated at a predetermined number of repetitions with a synchronization signal selected for each of the first to third sections, as a unit.

13. A display driver IC, comprising:
a register map configured to store a trim code of a fixed frequency, a window size, a compensation option, and a scatter option information;
an oscillator configured to generate an oscillator clock based on the trim code;
a timing controller configured to generate an internal synchronization signal based on the oscillator clock;
a DSI block configured to output a data valid signal when an image data packet is received;
an oscillator frequency controller comprising a frequency compensating block configured to receive the oscillator clock and an oscillator scatter configured to output a modified trim code; and
an intellectual property (IP) block configured to receive a modified oscillator clock from the oscillator based on the modified trim code,
wherein when an operating frequency deviates from a target frequency, the frequency compensating block generates a compensation trim code to compensate the operating frequency and the oscillator scatter generates the modified trim code by periodically applying a negative offset or a positive offset within a range specified with respect to the compensation trim code, to the oscillator.

14. The display driver IC of claim 13, wherein when the data valid signal is activated, the frequency compensating block generates the compensation trim code in accordance with a result sign value output based on a difference obtained by comparing a periodic value of the oscillator clock signal with the target periodic value, a step distance, and the compensation option.

15. The display driver IC of claim 13, wherein the oscillator scatter comprises:
an operation setter configured to select a calculating method in accordance with the scatter option information and set a magnitude of the negative offset or the positive offset, or interval information;
an operation synchronizer configured to output a calculated synchronization signal obtained by applying multiplication information to the internal synchronization signal in accordance with the interval information and the oscillator clock;
a first calculator configured to generate a result code to which the negative offset or the positive offset is applied based on the calculated synchronization signal responsive to the selected calculating method; and
a disable code confirmer configured to output the result code as the modified trim code, and when the result code is determined to be a predetermined disable code, output the result code as an available adjacent modified trim code.

16. The display driver IC of claim 15, wherein the multiplication information comprises a plurality of bits representing an integer data information and a decimal data information, and
when the plurality of bits evaluates to zero, the calculated synchronization signal is adjusted by a cycle based on an internal counter to be output.

17. The display driver IC of claim 13, wherein in the modified trim code, the positive offset and the negative offset are alternately generated based on the compensation trim code.

18. The display driver IC of claim 13, wherein in the modified trim code, the positive offset is periodically generated based on the compensation trim code.

19. The display driver IC of claim 13, wherein in the modified trim code, the negative offset is periodically generated based on the compensation trim code.

20. The display driver IC of claim 13, wherein in the modified trim code, a magnitude of the positive offset and a magnitude of the negative offset are independently set in the compensation trim code to offset each other.

21. A display driver IC, comprising:
   an oscillator configured to generate an oscillator clock based on a trim code;
   a timing controller, connected to the oscillator, configured to generate an internal synchronization signal based on the oscillator clock;
   an oscillator frequency controller, connected to the oscillator and the timing controller, configured to receive the internal synchronization signal and generate a modified trim code to the oscillator, wherein when an operating frequency of the oscillator deviates from a target frequency, the oscillator frequency controller generates the modified trim code to comprise a negative offset and a positive offset based on the trim code; and
   an intellectual property (IP) block, connected to the oscillator, configured to receive a modified oscillator clock from the oscillator based on the modified trim code.

22. The display driver IC of claim 21, wherein the trim code comprises information on an operating frequency for driving a display panel.

23. The display driver IC of claim 22, wherein the oscillator frequency controller comprises:
   a frequency compensating block configured to receive the oscillator clock and generate a compensation trim code; and
   an oscillator scatter configured to receive the compensation trim code, the internal synchronization signal, and a scatter option information, and generate the modified trim code.

24. The display driver IC of claim 23, wherein the oscillator scatter comprises:
   an operation setter configured to select a calculating method and set a magnitude of the negative offset or the positive offset, or interval information based on the scatter option information;
   an operation synchronizer configured to output a calculated synchronization signal based on the internal synchronization signal;
   a first calculator configured to generate a result code based on the calculated synchronization signal, the magnitude of the negative offset or the positive offset, and the interval information; and
   a disable code confirmer configured to receive the result code and output the modified trim code, and when the result code is determined to be a predetermined disable code, output the result code as an available adjacent modified trim code.

25. The display driver IC of claim 23, wherein the frequency compensating block comprises a compensation processor configured to compare a periodic value of the oscillator clock with a target periodic value and output the compensation trim code.

26. The display driver IC of claim 23 further comprising:
   a DSI block, connected to the frequency compensating block, configured to output a data valid signal when an image data packet is received,
   wherein the frequency compensating block compares a periodic value of the oscillator clock signal with a target periodic value, and generate the compensation trim code based on the comparison result.

* * * * *